United States Patent
Kim et al.

(10) Patent No.: US 9,966,048 B2
(45) Date of Patent: May 8, 2018

(54) MEMORY, DISPLAY DEVICE INCLUDING THE SAME, AND WRITING METHOD OF THE SAME

(71) Applicant: Samsung Display Co., Ltd., Yongin, Gyeonggi-Do (KR)

(72) Inventors: Yun Mi Kim, Changwon-si (KR); Ki Hyun Pyun, Gwangmyeong-si (KR); Sung Jun Kim, Cheonan-si (KR); Min Young Park, Busan (KR); Jeong Doo Lee, Asan-si (KR); Kyung Hwa Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 368 days.

(21) Appl. No.: 14/660,648

(22) Filed: Mar. 17, 2015

(65) Prior Publication Data

US 2016/0078957 A1  Mar. 17, 2016

(30) Foreign Application Priority Data

Sep. 15, 2014 (KR) .......................... 10-2014-0122130

(51) Int. Cl.
*G09G 5/395* (2006.01)
*G11C 7/16* (2006.01)
(Continued)

(52) U.S. Cl.
CPC ............ *G09G 5/395* (2013.01); *G09G 3/3648* (2013.01); *G09G 5/12* (2013.01); *G09G 5/393* (2013.01);
(Continued)

(58) Field of Classification Search
CPC ........ G09G 3/3648; G09G 5/12; G09G 5/363; G09G 5/395; G09G 2310/08;
(Continued)

(56) References Cited

U.S. PATENT DOCUMENTS 6,329,804 B1 * 12/2001 Mercer .................... G05F 3/30
323/314
7,355,582 B1  4/2008  Bell
(Continued)

FOREIGN PATENT DOCUMENTS

| KR | 1019970077726 A | 12/1997 |
|---|---|---|
| KR | 1020040048827 A | 6/2004 |
| KR | 1020050023539 A | 3/2005 |

*Primary Examiner* — Ke Xiao
*Assistant Examiner* — Jed-Justin Imperial
(74) *Attorney, Agent, or Firm* — H.C. Park & Associates, PLC (57) ABSTRACT

A memory is provided, which comprises an electrically erasable and programmable read only memory (EEPROM) configured to store an operation system and to be rewritable in response to a write operation signal, an address comparator configured to be connected to Inter Integrated Circuit (I2C) lines and output the write operation signal to the EEPROM in response to an external signal, a digital-to-analog converter (DAC) unit configured to determine whether to connect a DAC resistor and the I2C lines in response to the external signal and a pull-up resistor unit configured to be connected to the I2C lines.

17 Claims, 10 Drawing Sheets

(51) Int. Cl.
*G11C 16/08* (2006.01)
*G11C 16/10* (2006.01)
*G09G 3/36* (2006.01)
*G09G 5/12* (2006.01)
*G09G 5/393* (2006.01)
*G11C 16/26* (2006.01)

(52) U.S. Cl.
CPC ............... *G11C 7/16* (2013.01); *G11C 16/08* (2013.01); *G11C 16/10* (2013.01); *G09G 2330/021* (2013.01); *G09G 2360/12* (2013.01); *G11C 16/26* (2013.01)

(58) Field of Classification Search
CPC ......... G09G 2330/021; G09G 2360/12; G11C 7/16; G11C 16/08; G11C 16/10; G11C 16/102; G11C 16/26; G11C 16/28; H03M 1/66
See application file for complete search history.

(56) References Cited

U.S. PATENT DOCUMENTS

| | | | |
|---|---|---|---|
| 2002/0067638 A1* | 6/2002 | Kobayashi | G11C 7/1006 365/185.01 |
| 2010/0271738 A1* | 10/2010 | Tsai | H02H 9/046 361/56 |
| 2013/0242677 A1* | 9/2013 | Iyer | G11C 11/412 365/189.15 |
| 2013/0301355 A1 | 11/2013 | Yang | |
| 2014/0013151 A1 | 1/2014 | DeCesaris et al. | |

* cited by examiner

MEMORY, DISPLAY DEVICE INCLUDING THE SAME, AND WRITING METHOD OF THE SAME

CLAIM OF PRIORITY

This application claims priority to and all the benefits accruing under 35 U.S.C. § 119 Korean Patent Application No. 10-2014-0122130 filed on Sep. 15, 2014 in the Korean Intellectual Property Office ("KIPO"), the disclosure of which is incorporated herein by reference in its entirety.

BACKGROUND OF THE INVENTION

Field of the Invention

The invention relates to a memory, a display device including the memory and a method of writing data to the memory.

Description of the Related Art

Flat panel displays (FPDs) are display devices for visually presenting data, and may include a liquid crystal display (LCD), an electrophoretic display, an organic light-emitting display, an inorganic electroluminescent (EL) display, a field emission display (FED), a surface-conduction electron-emitter display, a plasma display, and a cathode ray tube (CRT) display.

In particular, LCDs, among other FPDs, have secured their position in the market not only developments in mass production technology therefor, but also due to their numerous benefits such as the ease of use of driving means therefor, low power consumption, thinness, high definitions and applicability to large screens, and the application area of LCDs has increasingly been enlarged.

Recently, timing controller merged integrated circuits (TMICs), which are chips with a timing controller and a data driver merged therein in a System-on-Chip (SoC) manner, have been used. The components of a SoC include a master, an arbiter, a slave and a shared bus.

The master may indicate a central processing unit (CPU), direct memory access (DMA), or a digital signal processor (DSP), and the slave may indicate a memory such as a synchronous dynamic random access memory (SDRAM) or a static random access memory (SRAM) or input/output means such as a universal serial bus (USB) and a universal asynchronous receiver transmitter (UART).

SoC-type TMICs not only can lower the size and design cost of chips, but also can consume less power and improve the performance of real-time processing. Accordingly, the use of SoC-type TMICs is on the increase.

In the meantime, a TMIC and an electrically erasable and programmable read only memory (EEPROM) may be connected by a serial clock line (SCL) and a serial data line (SDA).

The TMIC communicates data with a memory and a slave according to the Inter Integrated Circuit (I2C) protocol. A controller provided in a display device according to an exemplary embodiment of the invention is characterized in that it can control the I2C protocol in various manners based on command code present in a memory. An I2C communication method is a type of digital serial communication.

More specifically, the I2C communication method, which is a bidirectional 2-wire communication method, provides an SDA for performing data communication and an SCL for controlling and synchronizing data communication. The slave, which is connected to a data bus, may be identified by a unique address, and may thus be able to transmit or receive data.

However, as the size of a display panel increases, the storage capacity of the EEPROM increases, and as a result, the amount of data that needs to be processed also increases. At an initial stage of driving, a read operation needs to be performed between the master and the EEPROM. However, due to a limited amount of time, it is inevitable to increase a driving frequency applied to the SCL.

To adjust the consumption of power, the resistance values of pull-up resistors may be reduced so as to secure sufficient charges for each pixel.

However, in response to the pull-up resistors being designed to have a low resistance value, the influence of the master on the resistance component of a transmission line during the writing of data to the EEPROM may increase, and as a result, the reference voltage of the SCL may increase. On the other hand, in response to the pull-up resistors being designed to have a high resistance value, the driving frequency may increase, and as a result, each pixel may not be able to be sufficiently charged.

SUMMARY OF THE INVENTION

Exemplary embodiments of the invention provide a memory capable of maintaining a reference voltage and increasing a driving frequency.

However, exemplary embodiments of the invention are not restricted to those set forth herein. The above and other exemplary embodiments of the invention will become more apparent to one of ordinary skill in the art to which the invention pertains by referencing the detailed description of the invention given below.

According to an exemplary embodiment of the invention, a memory is provided which comprises an electrically erasable and programmable read only memory (EEPROM) configured to store an operation system and to be rewritable in response to a write operation signal, an address comparator configured to be connected to Inter Integrated Circuit (I2C) lines and output the write operation signal to the EEPROM in response to an external signal, a digital-to-analog converter (DAC) unit configured to determine whether to connect a DAC resistor and the I2C lines in response to the external signal and a pull-up resistor unit configured to be connected to the I2C lines.

According to another exemplary embodiment of the invention, a display device is provided which comprises a master configured to provide an external signal and a controller configured to output a data signal and a scan signal in response to the external signal, wherein the controller comprises a memory including an EEPROM, which stores an operation system and to be rewritable in response to a write operation signal, an address comparator, which is connected to I2C lines and outputs the write operation signal to the EEPROM in response to the external signal, a DAC unit, which determines whether to connect a DAC resistor and the I2C lines in response to the external signal, and a pull-up resistor unit, which is connected to the I2C lines.

According to another exemplary embodiment of the invention, a method of writing data to a memory, which comprises acquiring an external signal and determining whether the external signal is a write operation signal or a read operation signal, in response to a determination being made that the external signal is the write operation signal, opening up a connection between a DAC and I2C lines and rewriting data to an EEPROM in response to the write operation signal, wherein the I2C lines are electrically connected to a pull-up resistor unit.

According to the exemplary embodiments, it is possible to uniformly maintain the reference voltage of a clock line even in response to a high driving frequency being applied.

Other features and exemplary embodiments will be apparent from the following detailed description, the drawings, and the claims.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE EMBODIMENTS

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Exemplary embodiments will hereinafter be described with reference to the accompanying drawings.

Figure 1:
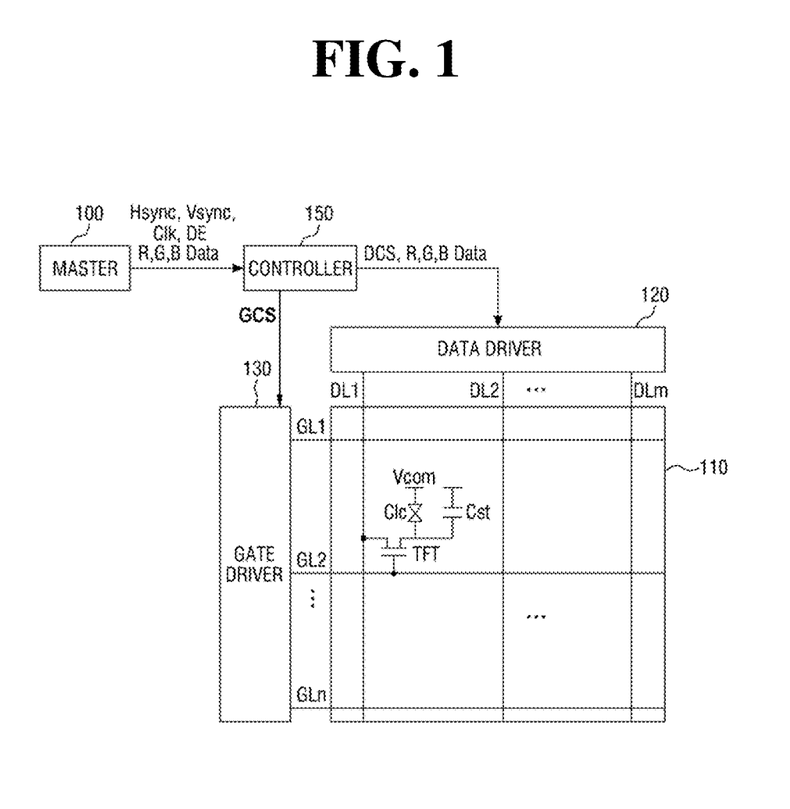
FIG. 1 is a block diagram of a display device according to an exemplary embodiment of the invention.

FIG. 1 is a block diagram of a display device according to an exemplary embodiment of the invention.

Referring to FIG. 1, a liquid crystal display (LCD) device according to an exemplary embodiment of the invention may include an LCD panel 110, which has a plurality of gate lines GL1 through GLn and a plurality of data lines DL1 and DLm that are provided to intersect the gate lines GL1 through GLn and a plurality of thin-film transistors (TFTs) that are for driving a plurality of liquid crystal capacitor Clc, respectively, and are provided at the intersections between the gate lines GL1 through GLn and the data lines DL1 through DLm, a data driver 120, which supplies a data signal to the data lines DL1 through DLm of the LCD panel 110, a gate driver 130, which supplies a scan signal to the gate lines GL1 through GLn of the LCD panel 110, and a controller 150, which controls the gate driver 130 and the data driver 120. The LCD device may also include a direct current DC-to-DC converter (not illustrated), which generates various voltages for driving the LCD panel 110, and a gamma voltage generator (not illustrated), which generates a gamma reference voltage and supplies the gamma reference voltage to the data driver 120.

A master 100 is a data processing medium provided outside the LCD device. For example, the master 100 may be a computer or a television (TV) set-top box (STB). The master 100 may transmit data obtained by data processing to the controller 150 of the LCD device from outside the LCD device, but the invention is not limited thereto. That is, nearly all types of data processing media capable of transmitting data to the LCD device may be used as the master 100.

The LCD panel 110 may include the TFTs, which are switching devices for individual pixels. Each of the TFTs has a gate electrode connected to one of the data lines DL1 through DLm and a drain electrode connected to the pixel electrode of a liquid crystal capacitor Clc and a storage capacitor Cst. A common voltage Vcom may be supplied to the common electrode of the liquid crystal capacitor Clc. The storage capacitor Cst may be charged with a data voltage applied thereto via one of the data lines DL1 through DLm in response to the corresponding TFT being turned on, and may thus uniformly maintain the voltage of the liquid crystal capacitor Clc.

In response to a scan pulse being sequentially supplied to the gate lines GL1 through GLn, the TFTs may be turned on, and may form a channel between their source and drain electrodes so as to supply a voltage applied thereto from the data lines DL1 through DLm to the pixel electrodes of the liquid crystal capacitors Clc. The alignment of liquid crystal molecules in each of the liquid crystal capacitors Clc may change due to an electric field between the pixel electrodes and the common electrodes of the liquid crystal capacitors Clc, and as a result, incident light may be modulated.

The data driver 120 may supply a data signal to the data lines DL1 through DLm in response to a data driver control signal DCS From the controller 150. Also, the data driver 120 may sample and latch input image data R, G, B Data provided by the controller 150, may convert the input image data R, G, B Data into an analog data voltage, which is needed for the liquid crystal capacitors Clc to render grayscale data, based on the gamma reference voltage provided by the gamma voltage generator, and may supply the analog data voltage to the data lines DL1 through DLm.

Examples of the data driver control signal DCS, which is provided by the controller 150, may include a source start pulse SSP, a source shift clock SSC, a source output enable signal SOE, and a polarity signal POL.

The gate driver 130 may generate a scan pulse in response to a gate driver control signal GCS from the controller 150, and may sequentially supply the scan pulse to the gate lines GL1 through GLn.

Examples of the gate driver control signal GCS may include a gate start pulse GSP, a gate shift clock GSC, and a gate output enable signal GOE.

The controller 150 may control the data driver 120 and the gate driver 130 by using a vertical synchronization signal Vsync, a horizontal synchronization signal Hsync, a data enable signal DE, a main clock signal Clk, and the data signal R, G, B Data.

Figure 5:
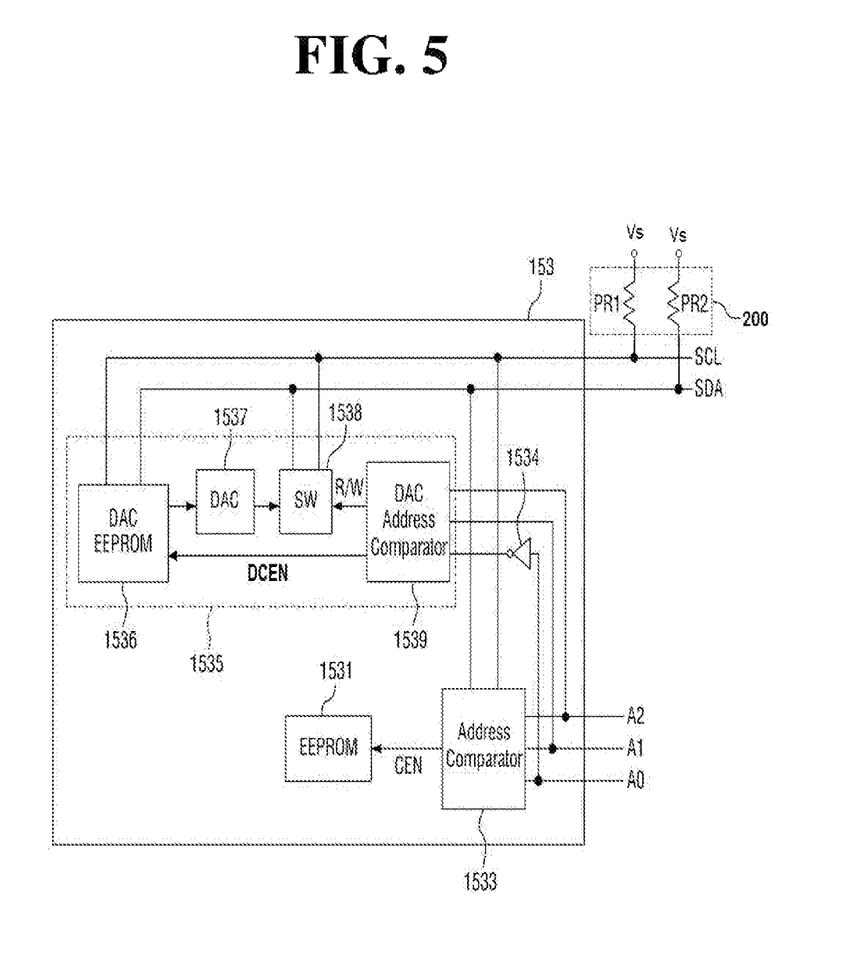
FIG. 5 is a block diagram of a memory of the display device.

The controller 150 may include an electrically erasable and programmable read only memory (EEPROM) 1531, in which data such as resolution information is stored, and an Inter Integrated Circuit (I2C) driver (not illustrated), to which the data present in the EEPROM 1531 is transmitted according to the I2C protocol, as illustrated in FIG. 5.

The master 100 may communicate with the I2C driver and the EEPROM 1531 according to the I2C protocol via a serial clock line (SCL) and a serial data line (SDA).

The SCL, i.e., a clock terminal, and the SDA, i.e., a data terminal, may be defined as terminals for communicating data among the master 100, the I2C driver and the EEPROM 1531 according to the I2C protocol. The clock terminal SCL and the data terminal SDA may be internally pulled down and grounded within the controller 150.

Figure 2:
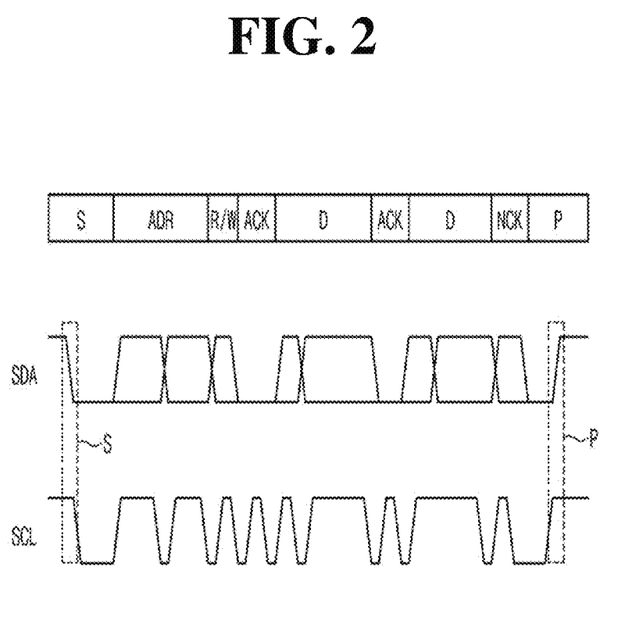
FIG. 2 is a timing diagram of a serial data line (SDA) and a serial clock line (SCL) provided to the display device.
Figure 3:
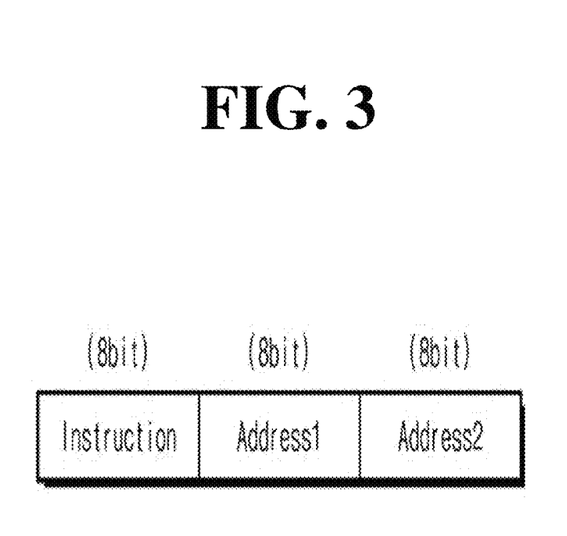
FIG. 3 is a diagram illustrating the data format of command code applied to the display device.

FIG. 2 is a timing diagram of a SDA and a SCL provided to the display device illustrated in FIG. 1, and FIG. 3 is a diagram illustrating the data format of command code applied to the display device illustrated in FIG. 1.

Referring to FIG. 2, a clock signal may be applied from the master 100 to the SCL, and a start signal S and data D may be applied from the master 100 to the SDA. A slave may transmit a positive acknowledgement signal ACK and effective data to the SDA. The master 100 may transmit a positive acknowledgement signal ACK and a pause signal P to the slave via the SDA.

In a case in which a signal on the SCL exists in its high state, a signal on the SDA may be changed from its high state to its low state in response to the start signal S. After the transmission of the start signal S, the master 100 may transmit a 7-bit address ADR, and may then transmit a read/write indicator signal R/W indicating a direction of the transmission of data.

After the transmission of the address ADR and the read/write indicator signal R/W, the master 100 may change the SDA to its high state. The slave may recognize the address ADR and may transmit a positive acknowledgement signal ACK to the master 100 by pulling down a signal on an I2C interface. On the other hand, in a case in which the slave does not recognize the address ADR, the slave may not reside in its low state, and may transmit a negative acknowledgement signal NAK to the master 100.

In response to a positive acknowledgement signal ACK being transmitted from the slave to the master 100, the master 100 or the slave may be able to transmit the data D to each other. More specifically, in a case in which a direction of the transmission of the data D is a "read" direction, the slave may transmit the data D to the master 100. On the other hand, in a case in which the direction of the transmission of the data D is a "write" direction, the master 100 may transmit the data D to the slave. In response to a positive acknowledgement signal ACK being received after the transmission of the data D, a transmitting device (i.e., the master 100 or the slave) that has transmitted the data D may transmit additional data to a receiving device (i.e., the slave or the master 100) that has received the data D.

The aforementioned data communication processes may continue until the transmitting device receives a negative acknowledgement signal NAK from the receiving device. The master 100 may restart or terminate data communication. A set of conditions for pausing data communication may include a case when the signal on the SCL exists in its high state and a case when the signal on the SDA is changed from its low state to its high state.

Command code will hereinafter be described with reference to FIG. 3.

Command code may include instruction code and address code. The instruction code is a command for giving instructions to execute a program, and may have a 8-bit data format. The address code may include a first address Address1, which is 8 bits long, and a second address Address2, which is also 8 bits long. The address code may be 16 bits long.

The instruction code, which is 8 bits long, may include a most significant bit, which may define a program instruction selection mode, and six middle bits, which may define instructions to start or end the I2C protocol and the number of times of executions of read/write instructions, and a least significant bit (LSB), which defines a read/write execution instruction mode. An I2C communication method allows the setting of various instruction codes and various address codes, and can thus be applied to numerous products that support the I2C communication method.

Figure 4:
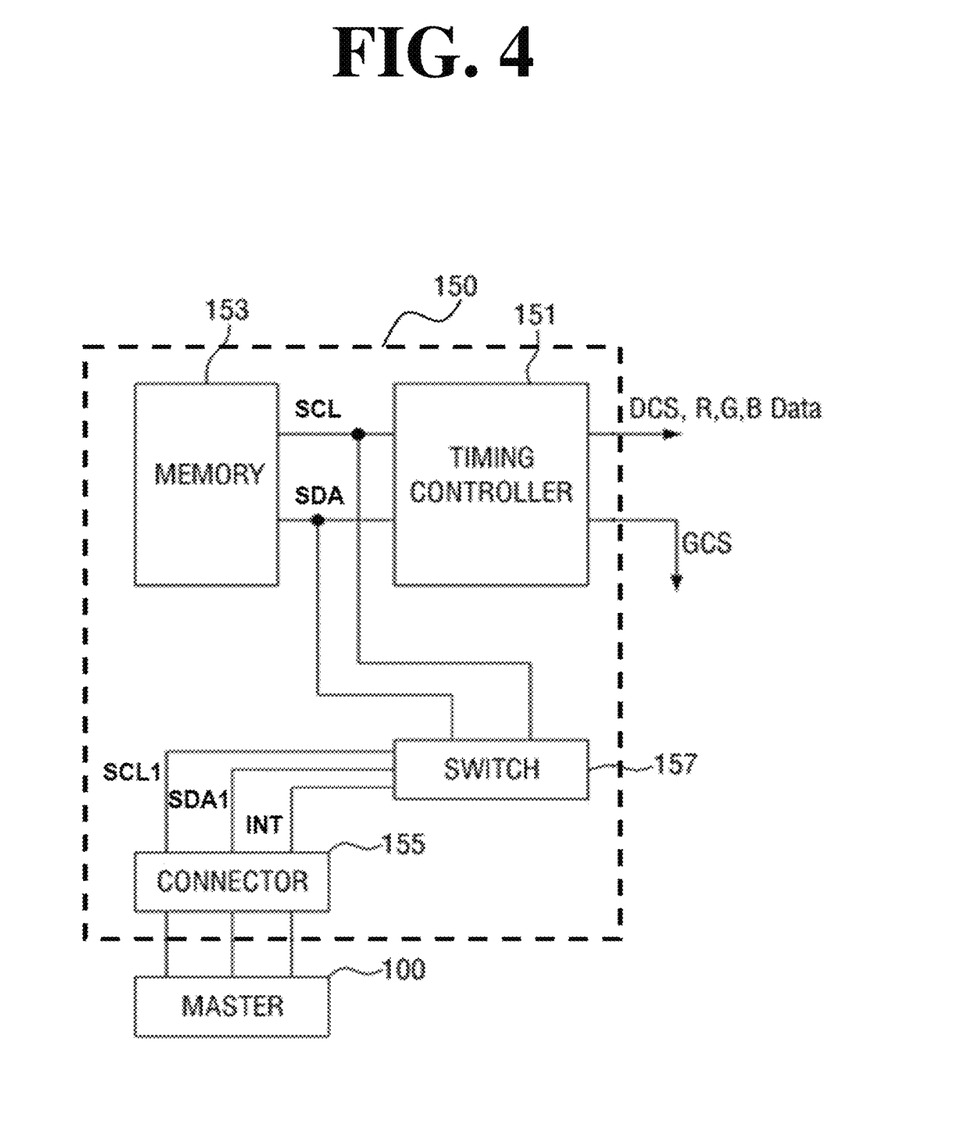
FIG. 4 is a block diagram of a controller of the display device.

FIG. 4 is a block diagram of a controller of the display device illustrated in FIG. 1.

Referring to FIG. 4, the controller 150 may include a timing controller 151, a memory 153, a connector 155 and a switch 157.

The timing controller 151 may transmit data provided by the master 100 to the data driver 120 and the gate driver 130. The timing controller 151 may receive an input image signal R, G, B and an input control signal for controlling the display of the input image signal R, G, B and may generate image data signal R, G, B Data and the data driver control signal DCS, and may provide the image data signal R, G, B Data and the data driver control signal DCS to the data driver 120. The timing controller 151 may receive an input control signal, such as the horizontal synchronization signal Hsync, the main clock signal Clk, or the data enable signal DE, and may output the data driver control signal DCS. The data driver control signal DCS is a signal for controlling the operation of the data driver 120. Examples of the data driver control signal DCS may include a horizontal synchronization start signal STH, which initiates the operation of the data driver 120, and a load signal, which gives instructions to output a data voltage. The timing controller 151 may provide the gate driver control signal GCS to the gate driver 130. Examples of the gate driver control signal GCS may include a gate clock signal, which determines when the gate driver 130 should output a gate-on voltage Von, and an output enable signal, which determines the pulse width of the gate-on voltage Von. The timing controller 151 may provide the gate driver control signal GCS, such as a start pulse signal and an output control signal, to the gate driver 130.

The memory 153 may transmit information corresponding to an external signal provided by the master 100 to the timing controller 151 via I2C lines, i.e., the SCL and the SDA.

More specifically, the memory 153 may include basic display parameters and characteristics, such as resolution information, horizontal and vertical frequency information, color information, maximum image size information, and frequency range limit information of a monitor, manufacturer information, model name information and serial number information of the monitor. The memory 153 may select information corresponding to the external signal provided by the master 100, and may provide the selected information to the timing controller 151 via the I2C lines.

The memory 153 may be configured to include a non-volatile memory, and particularly, an EEPROM (1531 in FIG. 5). In response to the memory 153 being configured to include an EEPROM, the information present in the memory 153 can be stably stored for a long time, and can be repeatedly modified by a user. Also, the information present in the memory 153 can be modified when memory 153 is already embedded in a system.

In response to the memory 153 including an EEPROM, a serial interface may be used for writing data to the memory 153, and an I2C interface or a serial peripheral interface (SPI) may be used as the serial interface for the memory 153. In the description that follows, it is assumed that the LCD device uses an I2C interface as the serial interface for the memory 153, but the invention is not limited thereto. That is, various other serial interfaces, such as an SPI, may be used for the memory 153.

The connector 155 may connect the master 100, which is provided on the outside of the LCD device, and the controller 150 of the LCD device. The connector 155 may transmit a plurality of signals to the switch 157. The connector 155 may provide a switch-on signal INT to the switch 157 and may thus control the operation of the switch 157.

The switch 157 may decide whether to transmit the external signal provided by the master 100 via the connector 155 to the memory 153. The connector 155 and the I2C lines may be electrically connected to each other according to the switch-on signal INT.

Figure 6:
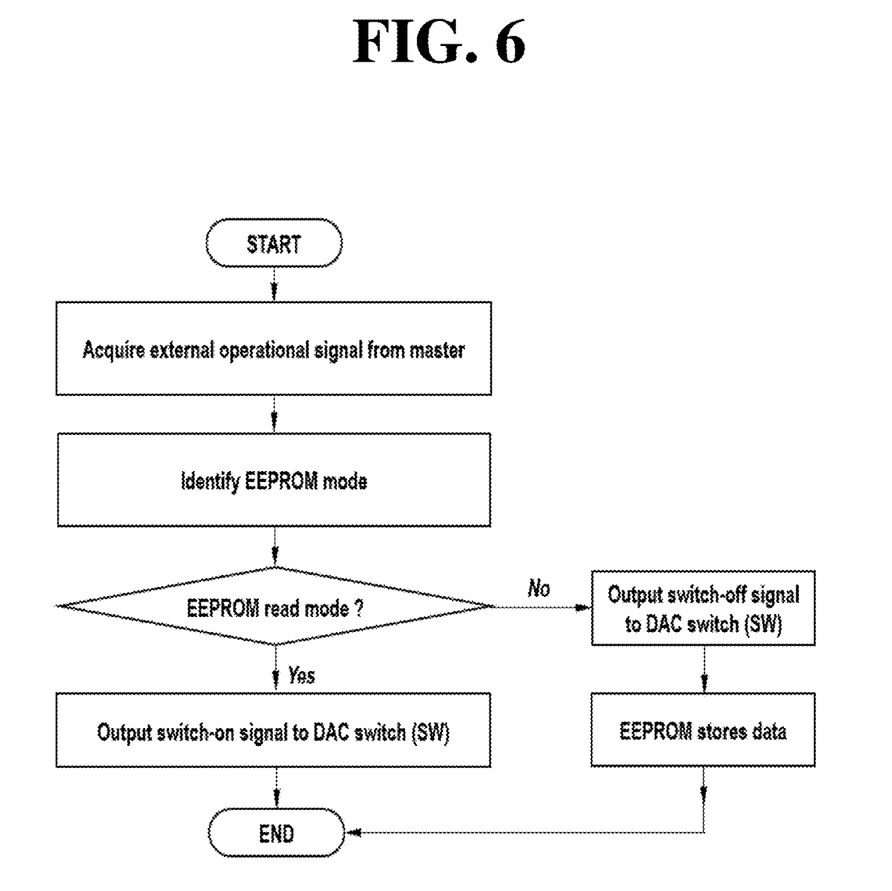
FIG. 6 is a flowchart illustrating an example of an operation of the memory.

FIG. 5 is a block diagram of a memory of the display device illustrated in FIG. 1, and FIG. 6 is a flowchart illustrating an example of an operation of the memory illustrated in FIG. 5.

Referring to FIG. 5, the memory 153 may include the EEPROM 1531, an address comparator 1533, an inverter 1534, and a digital-to-analog converter (DAC) unit 1535.

The EEPROM 1531 may control the timings of a write operation and a read operation for the EEPROM 1531 according to a control signal applied thereto via the address comparator 1533.

In response to data of the EEPROM 1531 being updated, a logic signal output from the I2C driver may be changed from a high signal to a low signal, and the low signal may be input to the EEPROM 1531 via the input terminal of a logic element. Accordingly, a write operation may be performed.

In response to the write operation being complete, the logic signal output from the I2C driver may be changed from its low state to its high state, and the LCD device may be driven according to the updated data of the EEPROM 1531.

A determination may be made as to whether to update the data of the EEPROM 1531 through communication with the use of the SCL and the SDA of the I2C driver.

The address comparator 1533 receives address code applied thereto via the I2C lines (i.e., the SCL and the SDA of the I2C driver), and provides the control signal CEN to the EEPROM 1531 such that a write operation can be performed on an address corresponding to the address code. The address of the address comparator 1533 may be determined by combining signals applied from first, second and third address pins A2, A1 and A0. An address generator (not illustrated) may provide an address of the EEPROM 1531 and an address of a DAC EEPROM 1536 via the first, second and third address pins A2, A1 and A0.

The address comparator 1533 may provide the control signal CEN to the EEPROM 1531, and at the same time, may provide a vertical or horizontal synchronization signal Vsync or Hsync, a data enable signal DE, a clock signal Clk and a data signal R, G, B Data into which basic display parameters and characteristics such as resolution information, horizontal and vertical frequency information, color information, maximum image size information, and frequency range limit information of a monitor are reflected to the timing controller 151 via the SCL and the SDA.

The DAC unit 1535 may include the DAC EEPROM 1536, a DAC 1537, a DAC switch (hereinafter, the SW) 1538, and a DAC address comparator 1539.

The DAC EEPROM 1536 may perform a write operation and a read operation according to a signal applied to via the DAC address comparator 1539 and the I2C lines (i.e., the SCL and the SDA).

In response to a read operation signal being applied via the I2C lines, the DAC EEPROM 1536 may determine the resistance value of a DAC resistor R1 based on a corresponding data to the read operation signal.

In response to a write operation signal being applied via the I2C lines, the DAC EEPROM 1536 may perform a write operation according to a DAC control signal DCEN, and may change the resistance value of the DAC resistor R1. The resistance applied to the DAC 1537 may vary depending on the resistance values of first and second pull-up resistors PR1 and PR2. A number of predefined resistance values may be stored in a lookup table of the DAC EEPROM 1536, and may be updated if necessary.

The DAC 1537 may convert a digital signal provided by the DAC EEPROM 1536 into an analog signal. More specifically, the DAC 1537 may set a variable resistor corresponding to the digital signal provided by the DAC EEPROM 1536, and may distribute a first voltage applied thereto. The structure of the DAC 1537 will be described later in detail with reference to FIG. 7.

The SW 1538 may connect the DAC 1537 to the SCL and the SDA according to the read/write indicator signal R/W applied thereto from the DAC address comparator 1539.

During a read operation, a read operation signal may be applied as the read/write indicator signal R/W, and the SW 1538 may be switched on so as to electrically connect the DAC 1537 to the SCL and the SDA. Since the DAC 1537, the SCL and the SDA are connected to one another in parallel, the total resistance of a transmission line may become lower than the resistance values of the first and second pull-up resistors PR1 and PR2.

During a write operation, a write operation signal may be applied as the read/write indicator signal R/W, and the SW 1538 may be switched off so as to electrically disconnect the DAC 1537 from the SCL and the SDA. Accordingly, the total resistance of the transmission line may become as high as the resistance values of the first and second pull-up resistors PR1 and PR2, which are connected to the SCL and the SDA, respectively.

In a case when the total resistance of the SCL and the SDA is high, the influence of the resistance of the transmission line during a write operation may be minimized, and as a result, a reference voltage VS may be uniformly maintained, which is beneficial to a write operation. However, in the case of a read operation, the period for which a high voltage is shortened due to voltage drops, and thus, data cannot be sufficiently read. The shortened high voltage period is more apparent when a driving frequency increases, and may thus impose a restriction on the increase of the driving frequency.

On the other hand, in a case when the total resistance of the SCL and the SDA is low, a sufficient period for which a high voltage is maintained can be secured during a read operation, and as a result, the driving frequency can be increased, which is beneficial to a read operation. However, in the case of a write operation, the reference voltage VS increases due to an increase in the resistance of the transmission line, and as a result, desired grayscale levels may not be rendered.

The DAC address comparator 1539 may be electrically connected to the first, second and third address pins A2, A1, and A0, and may be connected to the third address pin A0 via the converter 1534. Accordingly, the address generator may provide the DAC address comparator 1539 with a different address code from the address code provided to the address comparator 1533 by changing the phase of a signal applied via the third address pin A0. For example, in response to a signal applied to the address comparator 1533 having an address of "50" and the signal applied via the third address pin A0 being the last 1 bit of address code, an address of "51" may be provided to the DAC address comparator 1539.

The converter 1534 may be connected to the third address pin A0, but the invention is not limited thereto. That is, the converter 1534 may be connected to the first address pin A1 or the second address pin A2.

The DAC address comparator 1539 may receive address code applied thereto via the I2C lines (i.e., the SCL and the SDA), and may provide the DAC control signal DCEN to the DAC EEPROM 1536 such that a write operation can be performed on an address corresponding to the address code.

The DAC address comparator 1539 may provide the read/write indicator signal R/W to the SW 1538.

A pull-up resistor unit 200 may be connected to the SCL and the SDA, which are connected to the memory 153. The pull-up resistor unit 200 may include the first and second pull-up resistors PR1 and PR2. The first pull-up resistor PR1 may be connected between the SCL and the reference voltage VS, and the second pull-up resistor PR2 may be connected between the SDA and the reference voltage VS. The reference voltage VS may vary due to the resistance values of the first and second pull-up resistors PR1 and PR2 and the resistance of another transmission line. For example, the lower the resistance values of the first and second pull-up resistors PR1 and PR2, the higher the reference voltage VS applied to the SCL and the SDA, and the higher the resistance values of the first and second pull-up resistors PR1 and PR2, the lower the reference voltage VS applied to the SCL and the SDA.

The first pull-up resistor PR1 may be connected between the SCL and the reference voltage VS, and may be connected in parallel to the DAC resistor R1, which is connected to the SCL. The second pull-up resistor PR2 may be connected to the SDA, and may be connected in parallel to the DAC resistor R1, to which the SDA is connected.

Even though the resistance values of the first and second pull-up resistors PR1 and PR2 are fixed, the reference voltage VS may vary depending on the resistance of the DAC resistor R1, which is connected in parallel to the first and second pull-up resistors PR1 and PR2.

The operation of the memory of the display device illustrated in FIG. 1 will hereinafter be described with reference to FIG. 6.

Referring to FIG. 6, the memory 153 may acquire an external signal provided by the master 100 via the address comparator 1533 and the DAC address comparator 1539. The address comparator 1533 and the DAC address comparator 1539 may determine whether the external signal is a read operation signal or a write operation signal, and may thus allow a read operation or a write operation to be performed on the EEPROM 1531 and the DAC EEPROM 1536.

In response to a determination being made that the external signal is the read operation signal, the DAC EEPROM 1536 may provide the read operation signal to the SW 1538, and the SW 1538 may be switched on and may thus electrically connect the DAC resistor R1 to the SCL and the SDA.

In response to a determination being made that the external signal is the write operation signal, the DAC EEPROM 1536 may provide the write operation signal to the SW 1538, and the EEPROM 1531 and the DAC EEPROM 1536 may store data.

Figure 7:
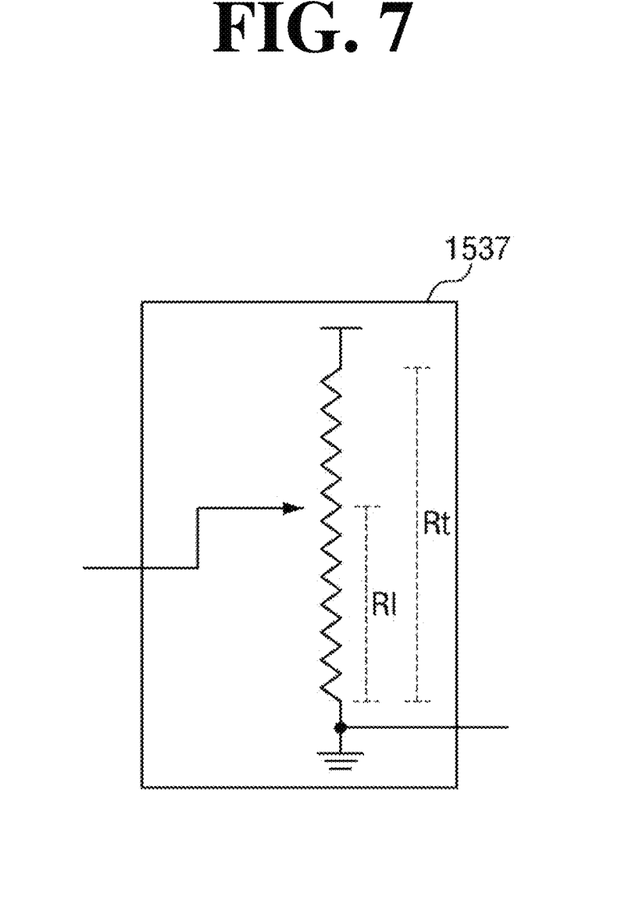
FIG. 7 is an equivalent circuit diagram of a digital-to-analog converter (DAC) illustrated in FIG. 5.

FIG. 7 is an equivalent circuit diagram of a DAC illustrated in FIG. 5.

Referring to FIG. 7, the DAC 1537 may include a variable resistor Rt. A first end of the variable resistor Rt may be connected to the SW 1538, and a second end of the variable resistor Rt may be connected to the DAC EEPROM 1536.

The DAC EEPROM 1536 may determine the resistance of the DAC resistor R1, which is to be connected to the pull-up resistor unit 200. The arrangement of the second end of the variable resistor Rt may be determined based on the determined resistance of the DAC resistor R1.

The resistance of the variable resistor Rt may be lower than the resistance of the first and second pull-up resistors PR1 and PR2. More specifically, the variable resistor Rt may be formed to have a higher resistance than the first and second pull-up resistors PR1 and PR2. However, in an exemplary embodiment, the variable resistor Rt may be formed to have a lower resistance than the first and second pull-up resistors PR1 and PR2.

Figure 8:
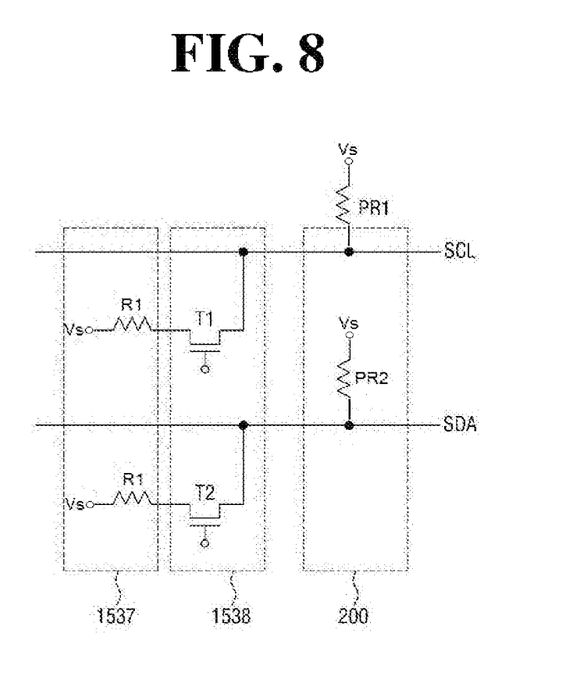
FIG. 8 is an equivalent circuit diagram illustrating how to connect the DAC and pull-up resistors of the display device.

FIG. 8 is an equivalent circuit diagram illustrating how to connect the DAC and pull-up resistors of the display device illustrated in FIG. 1.

Referring to FIG. 8, the SW 1538 may include first and second switching devices T1 and T2. During a read operation, the DAC EEPROM 1536 may provide a read operation signal to the SW 1538, and the first and second switching devices T1 and T2 may be switched on so as to electrically connect the DAC resistor R1 to the SCL and the SDA. During a write operation, the first and second switching devices T1 and T2 may be switched off so as to electrically disconnect the DAC resistor R1 from the SCL and the SDA.

Figure 9:
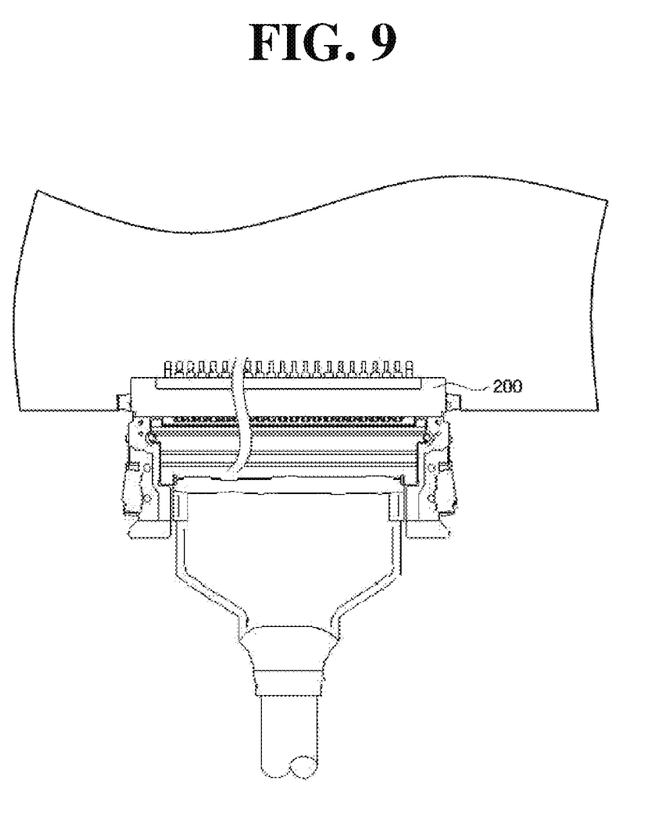
FIG. 9 is a perspective view of a connector of the display device.

FIG. 9 is a perspective view of a connector of the display device illustrated in FIG. 1.

Referring to FIG. 9, the connector 155 may be a 30-pin connector. A transmission cable connected to the connector 155 may be a DisplayPort cable, but the invention is not limited thereto. The transmission cable may be connected to the connector 155, and may thus electrically connect the master 100 and the memory 153. The transmission cable may include a main link, an auxiliary channel, a hot plug detection line, and an auxiliary power line. A video signal VIDEO and an audio signal AUDIO may be transmitted via the main link, and a monitor control signal MCCS may be transmitted via the auxiliary channel. The transmission cable may be connected to a 30-pin connector.

The connector 155 may include one or more electric overstress (EOS) protection resistors (not illustrated) to prevent EOS from being applied from the master 100. The EOS protection resistors may be provided on all interconnections to which the connector 155, the memory 153 and the switch 157 are connected. The EOS protection resistors may be connected to a transmission line, and may increase the influence of resistance components. The EOS protection resistors may have a resistance of, for example, 100Ω.

Figure 10:
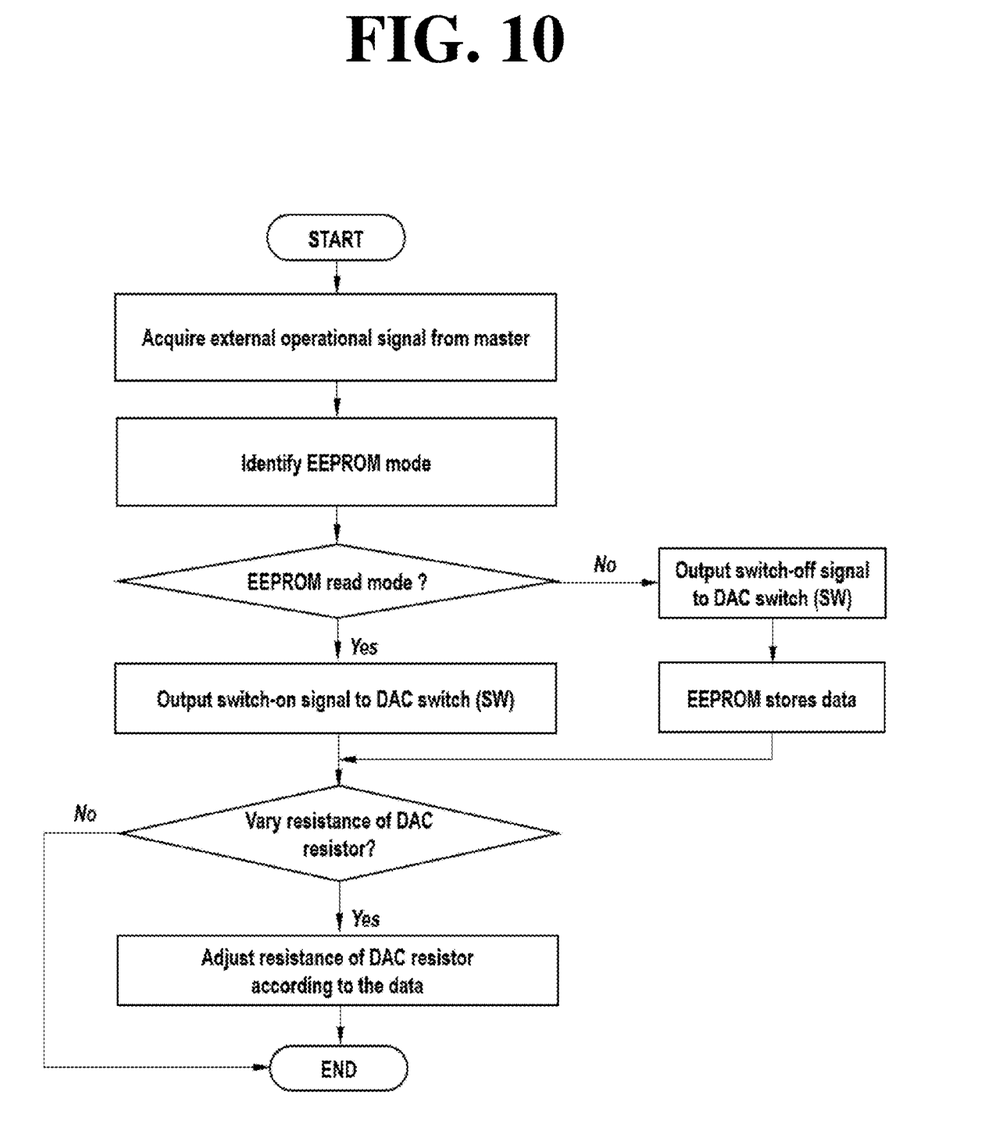
FIG. 10 is a flowchart illustrating another example of the operation of the memory.

FIG. 10 is a flowchart illustrating another example of the operation of the memory illustrated in FIG. 5.

Referring to FIG. 10, the memory 153 may acquire an external signal provided by the master 100 via the address comparator 1533 and the DAC address comparator 1539. The address comparator 1533 and the DAC address comparator 1539 may determine whether the external signal is a read operation signal or a write operation signal, and may thus allow a read operation or a write operation to be performed on the EEPROM 1531 and the DAC EEPROM 1536.

In response to a determination being made that the external signal is the read operation signal, the DAC EEPROM 1536 may provide the read operation signal to the SW 1538, and the SW 1538 may be switched on and may thus electrically connect the DAC resistor R1 to the SCL and the SDA.

In response to a determination being made that the external signal is the write operation signal, the DAC EEPROM 1536 may provide the write operation signal to the SW 1538, and the EEPROM 1531 and the DAC EEPROM 1536 may store data.

In a case when there is the need to change the resistance of the DAC resistor R1 of the DAC 1537, which is sometimes connected to the pull-up resistor unit 200, the DAC EEPROM 1536 may be provided with a DAC variation signal (not illustrated), and may adjust the resistance of the DAC resistor R1 by reflecting data present in the lookup table of the DAC EEPROM 1536. The resistance of the DAC resistor R1 may be determined based on the resistance values of the first and second pull-up resistors PR1 and PR2. Accordingly, if the resistance values of the first and second pull-up resistors PR1 and PR2 is fixed, the resistance of the DAC resistor R1 may be uniformly maintained. However, the resistance values of the first and second pull-up resistors PR1 and PR2 may vary depending on the state of the LCD device.

The DAC EEPROM 1536 may rewrite DAC data (not illustrated) to the DAC EEPROM 1536 in response to a DAC write operation signal from the I2C lines (i.e., the SCL and the SDA).

While the invention has been particularly shown and described with reference to exemplary embodiments thereof, it will be understood by those of ordinary skill in the art that various changes in provide and detail may be made therein without departing from the spirit and scope of the invention as defined by the following claims. The exemplary embodiments should be considered in a descriptive sense only and not for purposes of limitation.

What is claimed is:

1. A memory, comprising:
an electrically erasable and programmable read only memory (EEPROM) configured to store an operation system and to be rewritable in response to a write operation signal;
an address comparator configured to be connected to Inter Integrated Circuit (I2C) lines and output the write operation signal to the EEPROM in response to an external signal;
a digital-to-analog converter (DAC) unit configured to determine whether to connect a DAC resistor to the I2C lines in response to the external signal; and
a pull-up resistor unit configured to be connected to the I2C lines,
wherein:
the external signal includes a read operation signal and the write operation signal; and
the DAC unit includes:
 a DAC address comparator configured to output a switch-on signal in response to the read operation signal and to output a switch-off signal in response to the write operation signal;
 a DAC switch configured to electrically connect the DAC resistor to the I2C lines in response to the switch-on signal and to electrically disconnect the DAC resistor from the I2C lines in response to the switch-off signal; and
 a DAC configured to determine the resistance of the DAC resistor.

2. The memory of claim 1, wherein the address comparator and the DAC address comparator are further configured to be electrically connected to a plurality of address terminals and the DAC address comparator is further configured to be connected to at least one of the plurality of address terminals via a converter.

3. The memory of claim 1, further comprising:
a DAC EEPROM configured to be connected to the I2C lines, the DAC and the DAC address comparator and to store data regarding the resistance of the DAC resistor.

4. The memory of claim 3, wherein the DAC EEPROM is further configured to be rewritable in response to a DAC variation signal provided by the DAC address comparator.

5. The memory of claim 3, wherein the resistance of the DAC resistor is lower than the resistance of the pull-up resistor unit.

6. A display device, comprising:
a master configured to provide an external signal; and
a controller configured to output a data signal and a scan signal in response to the external signal,
wherein the controller comprises a memory including an EEPROM, which stores an operation system and to be rewritable in response to a write operation signal, an address comparator, which is connected to I2C lines and outputs the write operation signal to the EEPROM in response to the external signal, a DAC unit, which determines whether to connect a DAC resistor to the I2C lines in response to the external signal, and a pull-up resistor unit, which is connected to the I2C lines,
wherein the DAC resistor being arranged in parallel with the pull-up resistors and being connected to the I2C lines during a read operation to lower a total resistance of the I2C lines during the read operation, and the DAC resistor being disconnected from the I2C lines during a write operation so that the I2C lines maintain a high total resistance during the write operation.

7. The display device of claim 6, wherein the external signal includes a read operation signal and the write operation signal.

8. The display device of claim 7, wherein the DAC unit includes:
- a DAC address comparator, which outputs a switch-on signal in response to the read operation signal and outputs a switch-off signal in response to the write operation signal;
- a DAC switch, which electrically connects the DAC resistor to the I2C lines in response to the switch-on signal and electrically disconnects the DAC resistor from the I2C lines in response to the switch-off signal; and
- a DAC, which determines the resistance of the DAC resistor.

9. The display device of claim 8, wherein the address comparator and the DAC address comparator are further configured to be electrically connected to a plurality of address terminals and the DAC address comparator is further configured to be connected to at least one of the plurality of address terminals via a converter.

10. The display device of claim 8, wherein the memory further includes a DAC EEPROM, which is connected to the I2C lines, the DAC and the DAC address comparator and stores data regarding the resistance of the DAC resistor.

11. The display device of claim 10, wherein the DAC EEPROM is rewritable in response to a DAC variation signal provided by the DAC address comparator.

12. The display device of claim 10, wherein the resistance of the DAC resistor is lower than the resistance of the pull-up resistor unit.

13. The display device of claim 6, wherein the controller further comprises:
- a timing controller configured to be connected to the memory via the I2C lines; and
- a connector configured to connect the master and the memory.

14. The display device of claim 13, wherein the connector includes one or more electric overstress (EOS) protection resistors.

15. A method of writing data to a memory from a transmission line connected to the memory, comprising:
- acquiring an external signal from the transmission lines and determining whether the external signal is a write operation signal or a read operation signal;
- in response to a determination being made that the external signal is the write operation signal, disconnecting a DAC resistor from the transmission lines;
- writing data to the memory in response to the write operation signal; and
- in response to a determination being made that the external signal is the read operation signal, lowering a total resistance of the transmission lines by electrically connecting the DAC resistor to the transmission lines, wherein:
- a resistance of the DAC resistor is lower than the resistance of the pull-up resistor unit and is electrically connected in parallel to the pull-up resistor unit; and
- the transmission lines are electrically connected to a pull-up resistor unit.

16. The method of claim 15, further comprising:
allowing the memory to adjust the resistance of the DAC resistor in response to a DAC variation signal provided by the transmission lines.

17. The method of claim 15, further comprising:
- modifying a resistance of resistors arranged within the pull-up resistor unit; and
- writing data pertaining to a resistance of the DAC resistor to the memory in response to the modification of the pull-up resistor unit.

* * * * *